United States Patent
Kim et al.

(10) Patent No.: US 8,314,785 B2
(45) Date of Patent: Nov. 20, 2012

(54) PLASMA DISPLAY DEVICE

(75) Inventors: Jae-Won Kim, Suwon-si (KR); Seung-Hun Chae, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 533 days.

(21) Appl. No.: 12/554,849

(22) Filed: Sep. 4, 2009

(65) Prior Publication Data

US 2010/0085334 A1  Apr. 8, 2010

Related U.S. Application Data

(60) Provisional application No. 61/103,838, filed on Oct. 8, 2008.

(51) Int. Cl.
*G06F 3/038* (2006.01)

(52) U.S. Cl. .......................... 345/204; 345/60

(58) Field of Classification Search .................. None
See application file for complete search history.

(56) References Cited

U.S. PATENT DOCUMENTS

| | | |
|---|---|---|
| 7,180,241 B2 | 2/2007 | Ito |
| 7,187,427 B2 | 3/2007 | Ide et al. |
| 7,274,343 B2 | 9/2007 | Kim et al. |
| 7,535,700 B2 | 5/2009 | Chung |
| 7,656,089 B2 * | 2/2010 | Mo et al. .................. 313/582 |
| 2006/0108939 A1 | 5/2006 | Kang |
| 2006/0125721 A1 | 6/2006 | Min et al. |
| 2006/0132692 A1 | 6/2006 | Mo et al. |
| 2006/0238691 A1 | 10/2006 | Kawamura et al. |
| 2007/0139304 A1 | 6/2007 | Iwami et al. |
| 2008/0057746 A1 | 3/2008 | Yoo |
| 2008/0112117 A1 | 5/2008 | Chung |
| 2008/0164056 A1 | 7/2008 | Gettemy et al. |

FOREIGN PATENT DOCUMENTS

| | | |
|---|---|---|
| CN | 1979614 A | 6/2007 |
| CN | 101178864 A | 5/2008 |
| EP | 1 065 720 A2 | 1/2001 |
| EP | 1 975 688 A1 | 10/2008 |
| JP | 2004-102233 A | 4/2004 |
| JP | 2004-271611 A | 9/2004 |
| JP | 2005-018032 | 1/2005 |
| JP | 2005-338861 A | 12/2005 |
| JP | 2006-156384 A | 6/2006 |
| JP | 2006-189865 | 7/2006 |

(Continued)

OTHER PUBLICATIONS

Korean Patent Abstracts 1020060065109 A, corresponding to KR 10-0705818 Above, 2007.

(Continued)

*Primary Examiner* — Jason Olson
(74) *Attorney, Agent, or Firm* — Christie, Parker & Hale, LLP (57) ABSTRACT

A plasma display device includes a plasma display panel, a chassis base and circuit board assemblies mounted on the chassis base. The plasma display panel includes: a front substrate, a rear substrate, and a plurality of electrodes between the front and rear substrates; and an electrode pattern formed on the rear substrate and separate from the plurality of electrodes. The chassis base is adjacent the rear substrate. The electrode pattern is configured for transmitting power and signals utilized to drive the plurality of electrodes from at least one of the plurality of circuit board assemblies.

25 Claims, 7 Drawing Sheets

FOREIGN PATENT DOCUMENTS

| | | |
|---|---|---|
| JP | 2007-163920 A | 6/2007 |
| JP | 2008-176227 | 7/2008 |
| KR | 10-0705276 | 4/2007 |
| KR | 10-0705818 | 4/2007 |
| KR | 705276 | 4/2007 |
| KR | 705818 | 4/2007 |
| KR | 10-2008-0042282 | 5/2008 |

OTHER PUBLICATIONS

European Search Report dated Dec. 29, 2009, for corresponding European Patent application 09172475.7, noting listed references in this IDS.

SIPO Office action dated Jul. 26, 2011 in Chinese application No. 200910204022.9, pp. 1-5, with English language translation, 7 pps.

Japanese Patent Office action dated Aug. 16, 2011 in Japanese application No. 2009-214658, 4 pps.

KIPO Notice of Allowance dated Sep. 21, 2011, for corresponding application KR 10-2009-0089172, 5 pages.

Japanese Office action dated Jan. 31, 2012, for corresponding Japanese Patent application 2009-214658, 4 pages.

Patent Abstracts of Japan and English machine translation of Japanese Publication 2008-176227, listed above, 14 pages, 2008.

SIPO Letters Patent dated Jul. 11, 2012, for corresponding Chinese Patent application 200910204022.9, with English translation of cover page (3 pages).

* cited by examiner

PLASMA DISPLAY DEVICE

CROSS-REFERENCE TO RELATED APPLICATIONS

This application claims priority to and the benefit of U.S. Provisional Patent Application No. 61/103,838, filed on Oct. 8, 2008, the entire content of which is incorporated herein by reference.

BACKGROUND OF THE INVENTION

1. Field of the Invention

The present invention relates to a plasma display device that does not have an address buffer board assembly or has an address buffer board assembly that is reduced in size.

2. Description of the Related Art

In general, a plasma display device includes a plasma display panel (PDP) that displays an image, a chassis base that supports the PDP, and a plurality of printed circuit board assemblies mounted on the chassis base.

As is generally known, the PDP excites phosphors by using vacuum ultra-violet (VUV) rays radiated from plasma generated by gas discharge, and the excited phosphors are stabilized to generate red (R), green (G) and blue (B) visible light.

Among the printed circuit board assemblies (PBAs), an address buffer board assembly receives voltages and control signals from a power supply board assembly and a logic board assembly and is connected to address electrodes in the PDP through a flexible circuit, for example, a tape carrier package (TCP), to apply the voltages and the control signals.

The power supply board assembly transmits an address voltage Va to the address buffer board assembly, and the logic board assembly transmits a driver IC operation voltage (Vcc), driver IC control signals, clock signals, and address data signals to the address buffer board assembly, and the address buffer board assembly controls selected address electrodes according to the signals.

The above information disclosed in this Background section is only for enhancement of understanding of the background of the invention and therefore it may contain information that does not form the prior art that is already known in this country to a person of ordinary skill in the art.

SUMMARY OF THE INVENTION

In an exemplary embodiment according to the present invention, a plasma display device includes: a plasma display panel including: a front substrate, a rear substrate, and a plurality of electrodes between the front and rear substrates; and an electrode pattern formed on the rear substrate and separate from the plurality of electrodes; a chassis base adjacent the rear substrate; and a plurality of circuit board assemblies mounted on the chassis base, wherein the electrode pattern is configured for transmitting power and signals utilized to drive the plurality of electrodes from at least one of the plurality of circuit board assemblies.

The plurality of electrodes may include address electrodes, and the electrode pattern may be configured to transmit the power and the signals from a combined board assembly of the plurality of circuit boards. Further, the combined board assembly may be configured to provide logic and buffering for driving the address electrodes. The combined board assembly may be configured to provide an address voltage for driving the address electrodes through the electrode pattern.

The plasma display device may further include a tape carrier package including a driver IC for driving the plurality of electrodes. The plasma display device may further include a cover plate coupled to the chassis base, wherein the driver IC is mounted on the cover plate. The chassis base may include a bent portion, and the cover plate may be attached to the bent portion. The cover plate may be attached to the bent portion via a setscrew. A heat dissipation pad or thermal grease may be interposed between the cover plate and the driver IC.

One end of the TCP may be electrically coupled to the electrode pattern and an electrode terminal for the plurality of electrodes via thermo compression bonding.

The plasma display device may further include a flexible printed circuit for electrically coupling the electrode pattern to a combined board assembly of the plurality of circuit board assemblies. One end of the FPC may be electrically coupled to the address buffer/logic board assembly via a connector. The other end of the FPC may be electrically coupled to the electrode pattern via thermo compression bonding.

The FPC may include at least two FPCs, and the electrode pattern may be formed continuously between the at least two FPCs.

The FPC may be configured to transmit the signals to both right and left portions of the electrode pattern.

The electrode pattern may be located at an address electrode terminal side of the rear substrate.

The plasma display device may further include a plurality of bosses mounted on the chassis base, wherein the plurality of circuit board assemblies are mounted on the chassis base via the bosses.

The electrode pattern may include a plurality of voltage transmission electrodes and a plurality of signal transmission electrodes. A width of the voltage transmission electrodes may be greater than a width of the signal transmission electrodes. A distance between two adjacent ones of the voltage transmission electrodes may be greater than a distance between two adjacent ones of the signal transmission electrodes. The voltage transmission electrodes may include an address voltage transmission electrode for transmitting an address voltage for driving the address electrodes and an IC driving voltage transmission electrode for transmitting power for a driver IC for controlling the driving of the address electrodes. The voltage transmission electrodes may further include a ground electrode located between the address voltage transmission electrode and the IC driving voltage transmission electrode.

The signal transmission electrodes may include driver IC control signal transmission electrodes and clock/address data transmission electrodes for transmitting signals to control the driver IC. The signal transmission electrodes may further include a first ground electrode on one side of the clock/address data transmission electrodes and a second ground electrode on the other side of the clock/address data transmission electrodes. The clock/address data transmission electrodes may include pairs of electrodes for transmitting data signals in pairs.

The voltage transmission electrodes may be outermost electrodes of the electrode pattern. A distance between adjacent ones of the electrodes may be larger than a width of each of the adjacent ones of the electrodes.

The plasma display device may further include sealing member for protecting the plurality of electrodes and the electrode pattern. The sealing member may include a first sealing member between the TCP and the front substrate and a second sealing member between the electrode pattern and a portion of the TCP.

The plurality of circuit board assemblies may include a logic board assembly and at least one interface board assembly electrically coupled between the logic board assembly and the electrode pattern.

<Description of Reference Numerals Indicating Primary Elements in the Drawings>

| | |
|---|---|
| 1: | plasma display device |
| 10: | plasma display panel (PDP) |
| 20: | heat dissipation sheet |
| 30: | chassis base |
| 40: | printed circuit board assemblies (PBAs) |
| 60: | electrode pattern; |
| 11, 12: | rear substrate, front substrate |
| 13: | address electrode |
| 21: | double-sided adhesive tape |
| 31: | boss |
| 32: | setscrew |
| 33: | bent portion |
| 41: | sustain board assembly |
| 42: | scan board assembly |
| 43: | combined board assembly |
| 431: | logic board assembly |
| 432: | mini board assembly |
| 44: | power supply board assembly |
| 51, 52: | first and second sealing members |
| 61: | address voltage transmission electrode |
| 62: | ground electrode |
| 621, 622, 623: | first, second, and third ground electrodes |
| 63: | driver IC driving voltage transmission electrodes |
| 64: | driver IC control signal transmission electrode |
| 65: | clock/address data transmission electrode |
| 67: | anisotropic conductive film |
| 71: | interface flexible printed circuit (FPC) |
| 72: | TCP; |
| 73: | driver IC |
| W1, W2: | first and second line widths |
| D1, D2: | first and second line gaps |

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

In exemplary embodiments of the present invention, in order to simplify a configuration and to reduce manufacturing cost of the plasma display device, the address buffer board assembly is removed or its size is reduced. The functions of the address buffer board assembly are provided in another configuration of the plasma display device. In this case, the address electrodes should be stably controlled.

In an exemplary embodiment according to the present invention, a plasma display device that eliminates an address buffer board assembly is provided by incorporating functions of a conventional address buffer board assembly that electrically couples a logic board assembly and address electrodes in a combined board assembly and a plasma display panel.

According to one exemplary embodiment of the present invention, a plasma display device controls the address electrodes by forming an additional electrode pattern on a glass substrate at an address electrode terminal side of the plasma display panel and electrically coupling the address electrodes to the combined board assembly through the electrode pattern. This way, the configuration of the plasma display device can be simplified and a manufacturing cost thereof can be reduced.

According to another exemplary embodiment of the present invention, functions of a conventional address buffer board assembly are implemented in a reduced-sized mini board assembly (or mini board assemblies) and the plasma display panel, thereby simplifying the constitution of the plasma display device.

According to another exemplary embodiment of the present invention, the address electrodes can be stably controlled by setting a width of each electrode and a distance of adjacent electrodes in the electrode pattern formed on the glass substrate.

Figure 1:
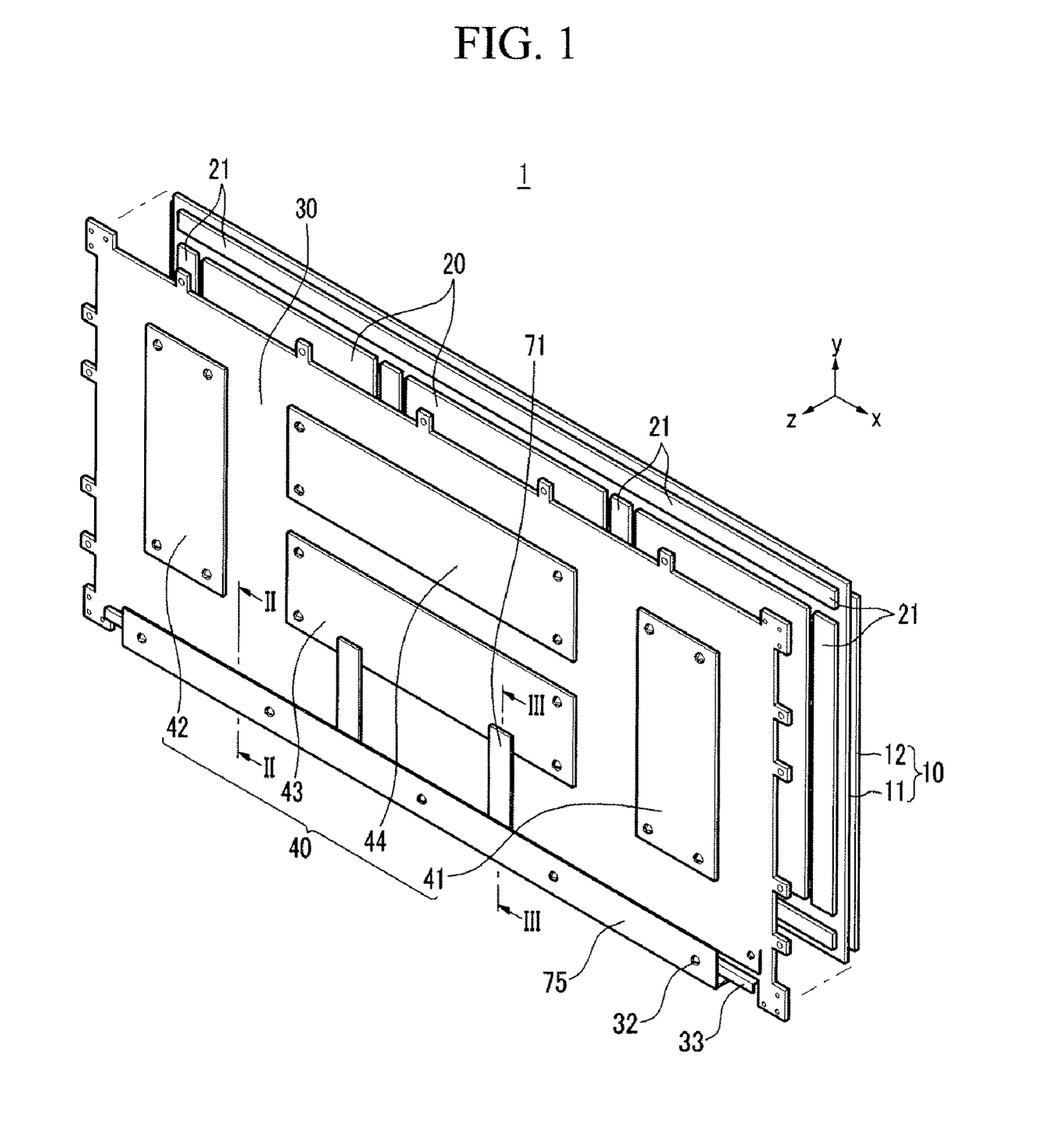
FIG. 1 is an exploded perspective view of a plasma display device according to a first exemplary embodiment of the present invention.

FIG. 1 is an exploded perspective view of a plasma display device according to a first exemplary embodiment of the present invention. Referring to FIG. 1, a plasma display device 1 according to the first exemplary embodiment includes a plasma display panel (PDP) 10 for displaying an image, a heat dissipation sheet 20, a chassis base 30, and a plurality of printed circuit board assemblies (PBAs) 40.

Briefly, the PDP 10 includes a rear substrate 11 and a front substrate 12 formed of glass, and electrodes for generating gas discharge. For example, the electrodes include sustain electrodes, scan electrodes (not shown), and address electrodes 13. For example, two different address electrodes are shown on FIG. 2 and FIG. 3. While only one address electrode 13 is shown on each of FIGS. 2 and 3 corresponding to the respective cross-sections, those skilled in the art would appreciate that the PDP 10 includes many more address electrodes 13 for displaying images on the PDP.

The present exemplary embodiment will be described primarily in reference to electrical coupling of the PDP 10 and the PBAs 40, and therefore, further detailed description of the PDP 10 will not be provided.

The heat dissipation sheet 20 is interposed between the PDP 10 and the chassis base 30, and dissipates heat generated during the gas discharge in the PDP 10. The heat dissipation sheet 20 promptly dissipates the generated heat.

The chassis base 30 is attached to the rear substrate 11 of the PDP 10 via a double-sided adhesive tape 21 to support the PDP 10, wherein the heat dissipation sheet 20 is interposed between the chassis base 30 and the PDP 10.

The plurality of PBAs 40 for driving the PDP 10 are mounted on the chassis base 30, and are electrically coupled to the PDP 10. The functions for driving the PDP 10 are distributed amongst and shared by the PBAs 40.

For example, the plurality of PBAs 40 includes a sustain board assembly 41 for controlling sustain electrodes (not shown), a scan board assembly 42 for controlling scan electrodes (not shown), a combined board assembly 43 that receives external video signals, generates controls signals for driving the sustain and scan electrodes, address electrodes and applies the control signals to the corresponding board assemblies, and a power board assembly 44 for supplying power for driving the board assemblies.

Figure 2:
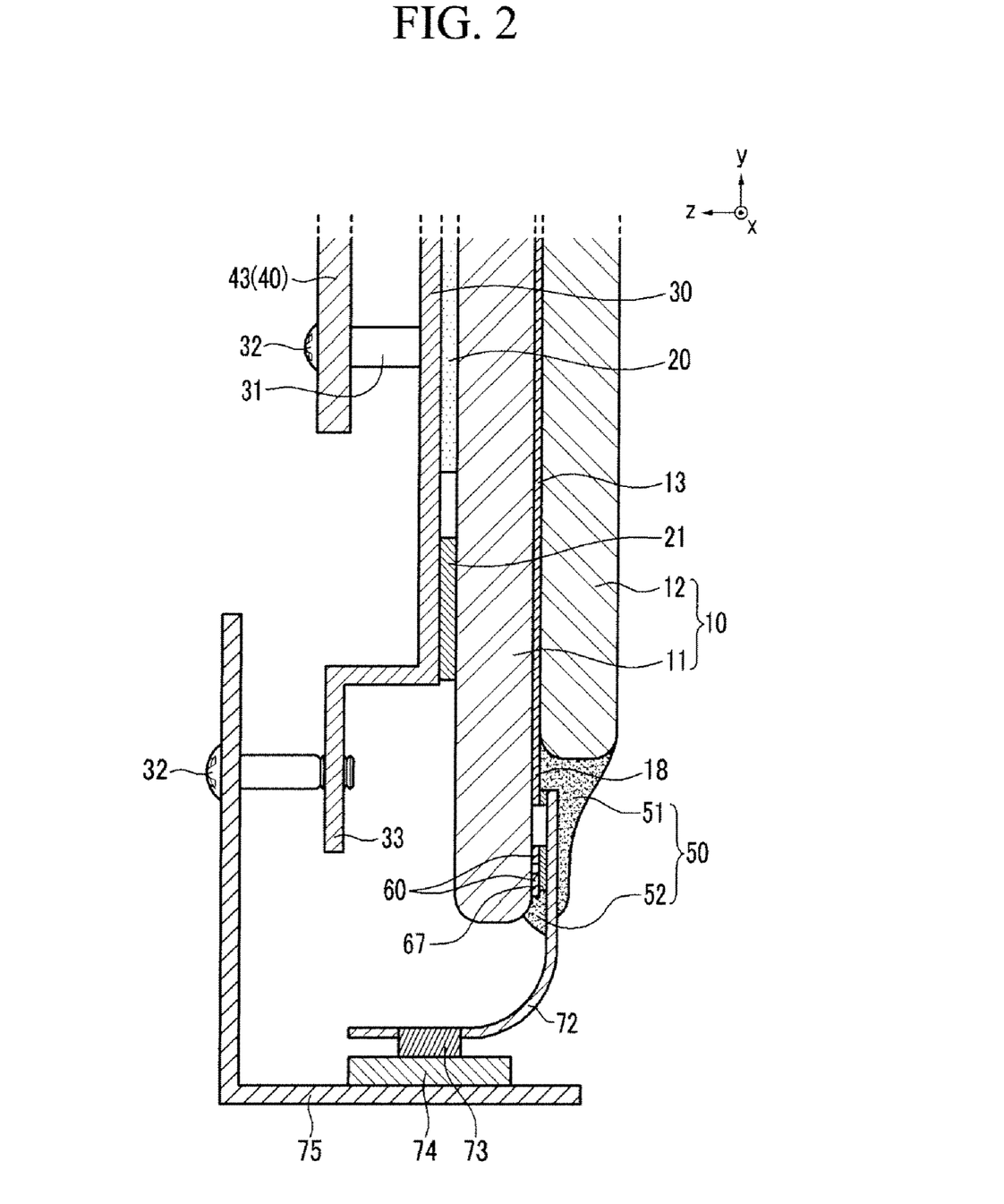
FIG. 2 is a cross-sectional view of FIG. 1, taken along the line II-II.
Figure 3:
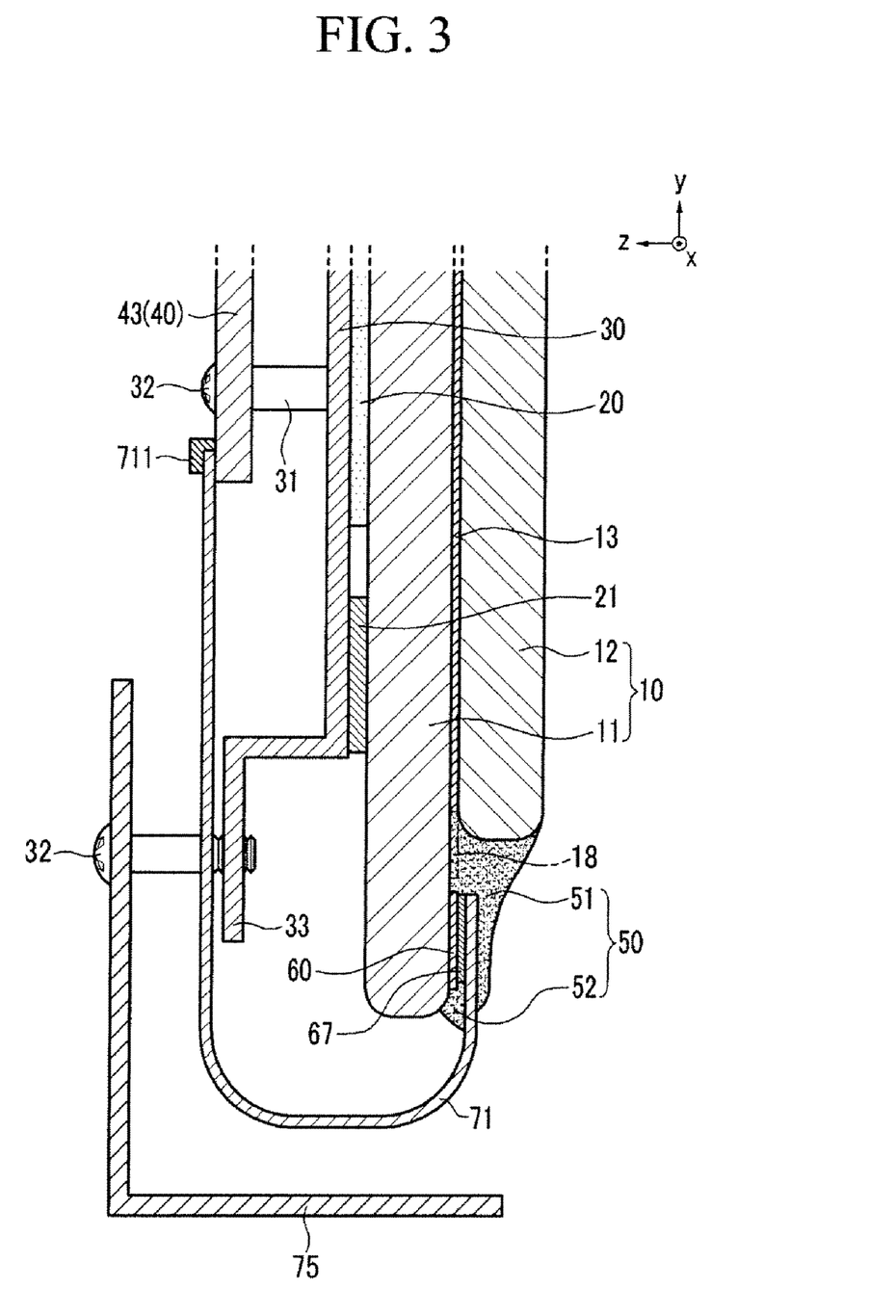
FIG. 3 is a cross-sectional view of FIG. 1, taken along the line III-III.

FIG. 2 is a cross-sectional view of FIG. 1, taken along the line II-II, and FIG. 3 is a cross-sectional view of FIG. 1, taken along the line II-II. Referring to FIG. 2 and FIG. 3, the PDP 10 is mounted on a front side of the chassis base 30, and the PBAs 40 are mounted on a rear side of the chassis base 30. The PBAs 40 are disposed on a plurality of bosses 31 provided in the chassis base 30 and a setscrew 32 is coupled to each of the bosses 31 such that the PBAs 40 are mounted on the chassis base 30 via the bosses 31 and are attached to the bosses 31 by the setscrews 32.

The sustain board assembly 41 is electrically coupled to the sustain electrodes through a flexible printed circuit (FPC) (not shown), and the scan board assembly 42 is electrically coupled to the scan electrodes through a flexible printed circuit (FPC) (not shown). Unlike in a conventional plasma display device, an address buffer board for controlling the address electrodes 13 is not separately provided in the first exemplary embodiment of the present invention. That is, the PBAs 40 do not include an address buffer board assembly. Accordingly, a structure of the plasma display device 1 is simplified and manufacturing cost is reduced.

Figure 4:
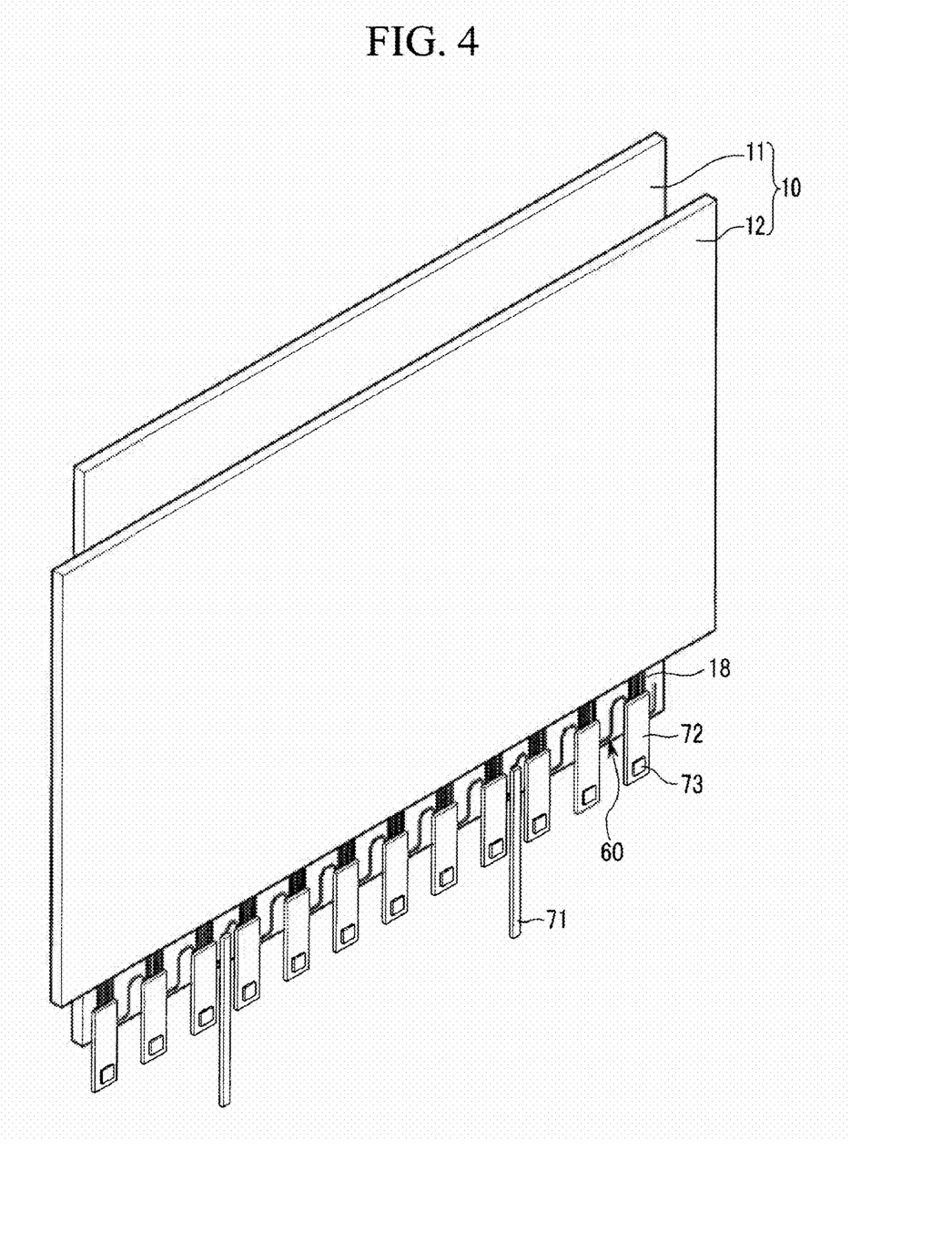
FIG. 4 is a perspective top-front view of a plasma display panel (PDP) of FIG. 1.
Figure 5:
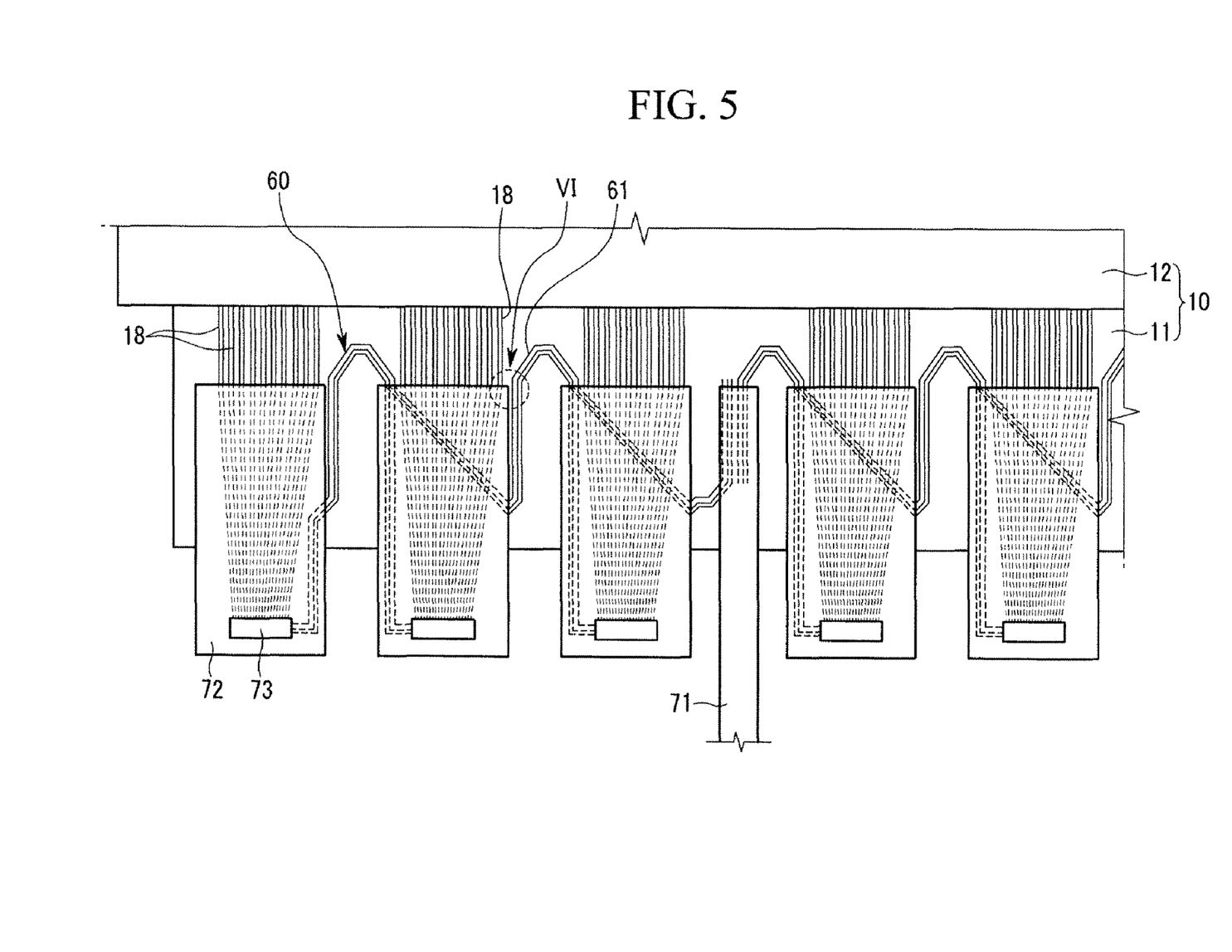
FIG. 5 is a schematic view illustrating connection state of an electrode pattern formed on a glass substrate, TCPs and an interface flexible circuit.

FIG. 4 is a top-front perspective view of the PDP of FIG. 1, and FIG. 5 is a schematic view illustrating connection state of an electrode pattern formed on glass substrate shown in FIG. 4, TCPs 72 and an interface flexible printed circuit (FPC) 71. Referring to FIGS. 4 and 5, the PDP 10 further includes an electrode pattern 60 for controlling the address electrodes 13 according to exemplary embodiment of the present invention. As can be seen in FIGS. 4 and 5, the electrode pattern 60 is formed continuously between the two interface flexible printed circuits (FPCs) 71. Because of the location of the interface flexible printed circuits (FPCs) 71 with respect to the electrode pattern 60, each FPC is configured to transmit the signals to both right and left portions of the electrode pattern 60.

In addition, referring to FIG. 1 to FIG. 3, the electrode pattern 60 is electrically coupled to the combined board assembly 43 through the interface flexible printed circuit (FPC) 71, and electrically coupled to the address electrodes 13 through a TCP 72. In other words, the electrode pattern 60 electrically couples the interface flexible printed circuit (FPC) 71 with the TCP 72.

Patterning of the electrode pattern 60 can be performed by a process for forming the address electrodes 13 on the rear substrate 11. Therefore, an additional process for forming the electrode pattern 60 is not separately required according to a manufacturing process of the plasma display device 1.

The electrode pattern 60 is continually formed at a position of an address electrode terminal 18 on the rear substrate 11. A first end of the interface flexible printed circuit (FPC) 71 is electrically coupled to the combined board assembly 43 via connector 711 and a second end of the interface flexible printed circuit (FPC) 71 is electrically coupled to the electrode pattern 60 by thermo compression bonding. Accordingly, the interface flexible printed circuit (FPC) 71 transmits signals from the combined board assembly 43 to the electrode pattern 60.

At least one of the interface flexible printed circuits (FPCs) 71 electrically couples the combined board assembly 43 to the electrode pattern 60. In addition, a plurality of the TCPs 72 is electrically coupled to the electrode pattern 60. That is, a first end of the TCP 72 is electrically coupled to the electrode pattern 60 and the address electrode terminal 18 by thermo compression bonding, respectively, and a second end of the TCP 72 forms a free end therein. Here, the TCP 72 is separated from the portion of the electrode pattern 60, i.e., the portion arranged in diagonal direction in FIG. 5, other than the thermo compression bonded portion.

In exemplary embodiments, an anisotropic conductive film (ACF) 67 including a plurality of conductive balls is used for thermo compression bonding to electrically couple the TCPs 72 and the interface flexible printed circuits (FPCs) 71 to the electrode pattern 60. In other embodiments, any other suitable methods may be used for electrically coupling the TCPs 72 and the interface flexible printed circuits (FPCs) 71 to the electrode pattern 60.

Each of the TCPs 72 includes a driver integrated circuit (IC) 73 for controlling the address electrodes 13. The driver IC 73 is driven by voltages and control signals transmitted from the combined board assembly 43 through the interface flexible printed circuit (FPC) 71 and the electrode pattern 60.

Figure 6:
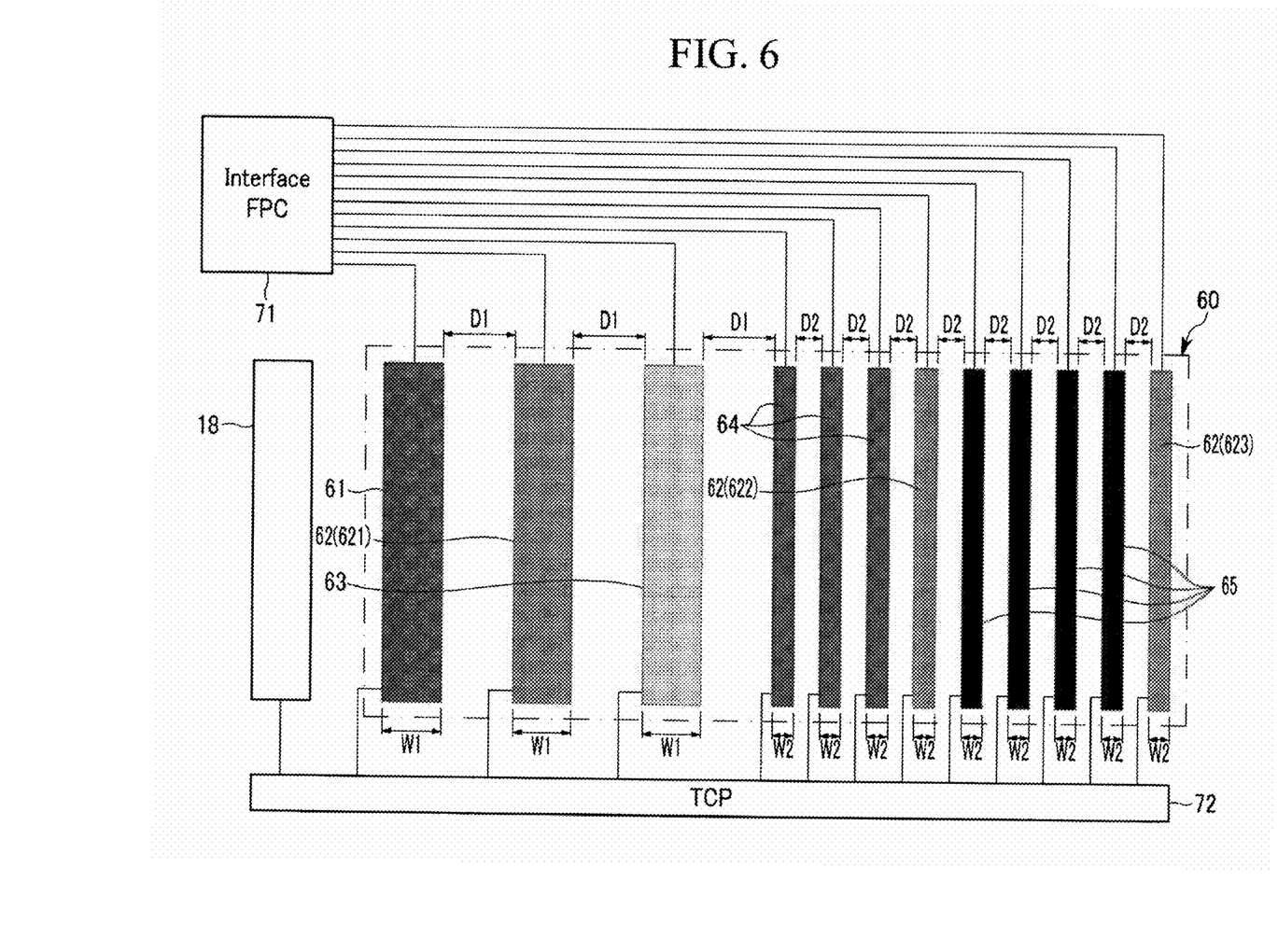
FIG. 6 is a schematic top plan view of an electrode pattern formed on a glass substrate of FIG. 4.

FIG. 6 is a schematic top plan view of the electrode pattern 60 formed on the glass substrate 11 of FIG. 4. Referring to FIGS. 5 and 6, the electrode pattern 60 has electrodes for transmitting the voltages (or power) and the control signals transmitted from the combined board assembly 43 to the driver IC 73 of the TCP 72.

The electrode pattern 60 that transmits voltages and control signals to the driver IC 73 of the TCP 72 from the combined board assembly 43 will be described below. The number of electrodes in the electrode pattern 60 can be set according to types of voltages and control signals transmitted from the combined board assembly 43.

For example, the electrode pattern 60 includes an address voltage transmission electrode 61 that transmits an address voltage Va (e.g., 50V to 70V), a ground electrode 62 that grounds the driver IC 73, a driver IC driving voltage transmission electrode 63 that transmits a driving voltage Vcc (e.g., 3.3V to 5.0V) of the driver IC 73, a driver IC control signal transmission electrode 64 that transmits a driver IC control signal (e.g., 3.3V to 5.0V), and a clock/address data transmission electrode 65 that transmits a clock signal and an address data signal (e.g., several mV).

In the electrode pattern 60, the address voltage transmission electrode 61, the ground electrode 62, and the driver IC driving voltage transmission electrode 63 form a power terminal, and the driver IC control signal transmission electrode 64 and the clock/address data transmission electrode 65 form a signal and data terminal.

The rear substrate 11 has a limited space for forming the electrode pattern 60 at the side of the address electrode terminal 18. Therefore, a line width of electrodes 61, 62, 63, 64, and 65 and a line gap between neighboring electrodes 61, 62, 63, 64, and 65 should be considered in order to provide control voltages to the address electrodes 13 for an addressing operation.

For example, the address voltage transmission electrode 61, the ground electrode 62, and the driver IC driving voltage transmission electrode 63 that form the power terminal have wider line widths than those of the driver IC control transmission electrode 64 and the clock/address data transmission electrode 65 that form the signal and data terminal.

When the line widths of the address voltage transmission electrode 61, the ground electrode 62, and the driver IC driving voltage transmission electrode 63 are narrower than a required line width, impedances of these electrodes 61, 62, 63 are increased, which may cause erroneous operation of the driver IC 73. In addition, if the line gaps set between the address voltage transmission electrode 61, the ground electrode, and the driver IC driving voltage transmission electrode 63 that form the power terminal are narrower than the line distances set between the driver IC control signal transmission electrodes 64 and the clock and address data transmission electrodes 65, signal distortion may occur in peripheral control signals according to a current flow of the power terminal. Accordingly, the PDP 10 may perform erroneous operation.

In order to prevent the driver IC 73 and the PDP 10 from performing erroneous operation, in exemplary embodiments, the address voltage transmission electrode 61, the ground electrode 62, and the driver IC driving voltage transmission electrode 63 that form the power terminal each has a first line width W1, and the first line width W1 is larger than a second line width W2 of the driver IC control signal transmission electrodes 64 and the clock/address data transmission electrodes 65 that form the signal and data terminal. That is, W1>W2.

In order to facilitate forming a larger line width, the address voltage transmission electrode 61, the ground electrode 62, and the driver IC driving voltage transmission electrode 63 are located at outermost portion of the electrode pattern 60.

In addition, the address voltage transmission electrode 61, the ground electrode 62, and the driver IC driving voltage transmission electrode 63 has a first line distance D1 therebetween, and the first line distance D1 is larger than a second line distance D2 between the driver IC control signal transmission electrodes 64 and between the clock/address data transmission electrodes 65. That is, D1>D2.

The clock/address data transmission electrodes 65 are adjacent to each other as pairs since they transmit signals in pairs, and are located at a distance from the address voltage transmission electrode 61 and the driver IC driving voltage transmission electrode 63 in order to avoid distortion of signals due to high voltage current flow. In FIG. 6, two pairs of the clock/address data transmission electrodes 65 are located adjacent to each other.

For example, the ground electrode 62 may include a first ground electrode 621 interposed between the address voltage transmission electrode 61 and the data driver IC driving voltage transmission electrode 63, and second and third ground electrodes 622 and 623 located at both sides of the clock/address data transmission electrodes 65.

The first line distance D1 according to the present exemplary embodiment also applies to a distance between the driver IC driving voltage transmission electrode 63 and the nearest one of the driver IC control signal transmission electrodes 64.

In addition, the second line distance D2 also applies to respective distances between the driver IC control signal transmission electrode 64 and the second ground electrode 622, between the second ground electrode 622 and the clock/address data transmission electrode 65, and between the clock/address data transmission electrode 65 and the third ground electrode 623. As such, the respective distances are set to be the same.

In addition, in the electrode pattern 60, the first and second line widths W1 and W2 of the electrodes 61, 62, 63, 64, and 65 are less than the first and second distances D1 and D2, respectively. That is, the first line distance D1 is larger than the first line width W1, and the second line distance D2 is larger than the second line width W2. In the electrodes 61, 62, 63, 64, and 65, the line width and the line distance of the power terminal are respectively set to be greater than the line width and the line distance of the signal and data terminal. Accordingly, an excessive increase of the impedances of the electrodes 61, 62, 63, 64, and 65 can be prevented and signal distortion of other neighboring control signals can be prevented or reduced.

Referring back to FIG. 2 and FIG. 3, the TCP 72 electrically coupled to the electrode pattern 60 is also electrically coupled to the address electrode terminal 18 so as to apply control signals (or voltages) to the address electrodes 13. In order to seal a gap between the electrode pattern 60 and the connection part of TCP 72 and the electrode pattern 60, a first sealing member 51 and a second sealing member 52 are provided.

For example, the first sealing member 51 and the second sealing member 52 are formed at both sides of the TCP 72, interposing the TCP 72 therebetween. The first sealing member 51 is formed between an end portion of the TCP 72 and an end portion of the front substrate 12, facing the end portion of the TCP 72 to seal a gap between the TCP 72 and the front substrate 12. The second sealing member 52 is formed between an end portion of the electrode pattern 60 and a portion of the TCP 72, facing the end portion of the electrode pattern 60 to seal a gap between the electrode pattern 60, the rear substrate 11, and the TCP 72.

Similarly, as can be seen in FIG. 3, the first sealing member 51 seals a gap between the interface flexible printed circuit (FPC) 71 and the end portion of the front substrate 12. Further, the second sealing member 52 seals a gap between the interface flexible printed circuit (FPC) 71, an end portion of the electrode pattern 60, the rear substrate 11, and a portion of the interface flexible printed circuit (FPC) 71.

The driver IC 73 provided in the TCP 72 includes a heat dissipation pad 74 or thermal grease (not shown), and is supported by a cover plate 75. The cover plate 75 is mounted on a bent portion 33 of the chassis base 30 by a setscrew 32 and protects the TCP 72.

Figure 7:
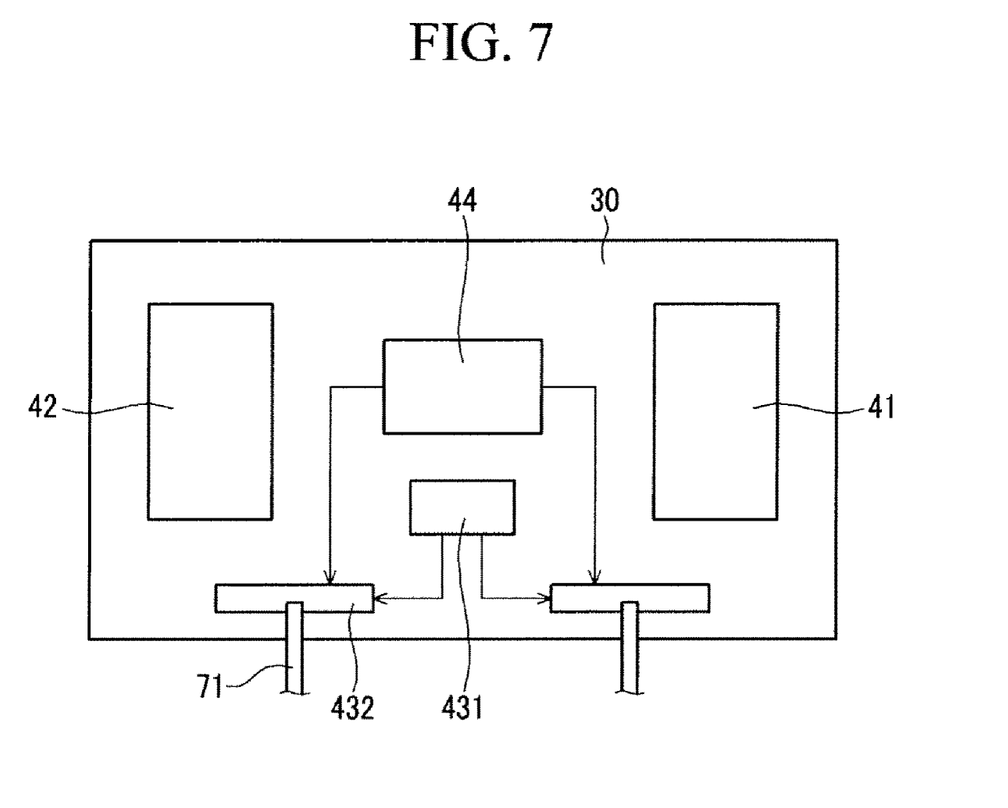
FIG. 7 is a rear view of a plasma display panel (PDP) according to a second exemplary embodiment of the present invention.

FIG. 7 is a rear view of a plasma display panel (PDP) according to a second exemplary embodiment of the present invention.

Referring to FIG. 7, the plasma display device according to the second exemplary embodiment has a pair of mini board assemblies 432 that are reduced in size in comparison to a conventional address buffer board assembly without eliminating the entire address buffer board assembly as in the first exemplary embodiment. While two mini board assemblies 432 are illustrated in FIG. 7, in other embodiments only one or more than three mini board assemblies may be used. The mini board assembly may also be referred to as an interface board assembly, as it electrically couples the logic board assembly to the electrode pattern.

Here, functions of a conventional address buffer board assembly are implemented in the mini board assemblies 432 and the electrode pattern 60. Hence, the constitution (or configuration) of the mini board assemblies 432 is more simplified compared with the conventional address buffer board assembly, thereby reducing the size of printed circuit board assemblies of the plasma display device and cost of production.

With the mini board assemblies 432, among the voltage and signals controlling the address electrodes 13, the address voltage Va is transmitted from the power supply board assembly 44 to the mini board assemblies 432, and then from the mini board assemblies 432 to the electrode pattern 60 and the TCP 72 via the interface flexible printed circuits (FPC) 71.

Ground of the driver IC 73, driving voltage Vcc of the driver IC 73, control signals of the driver IC 73, clock signals and address data signals are transmitted from the logic board assembly 431 to the mini board assemblies 432, and then from the mini board assemblies 432 to the electrode pattern 60 and the TCP 72 via the interface flexible printed circuit (FPC) 71.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A plasma display device comprising:
   a plasma display panel comprising:
      a front substrate, a rear substrate, and a plurality of electrodes between the front and rear substrates, the plurality of electrodes comprising address electrodes; and
      an electrode pattern formed on the rear substrate and separate from the plurality of electrodes;
   a chassis base adjacent the rear substrate; and
   a plurality of circuit board assemblies mounted on the chassis base,
   wherein the electrode pattern is configured for transmitting power and signals utilized to drive the plurality of electrodes from at least one of the plurality of circuit board assemblies, and comprises a plurality of voltage transmission electrodes and a plurality of signal transmission electrodes, and
   wherein the voltage transmission electrodes comprise an address voltage transmission electrode for transmitting an address voltage for driving the address electrodes and an IC driving voltage transmission electrode for transmitting power for a driver IC for controlling the driving of the address electrodes.

2. The plasma display device of claim 1, wherein the electrode pattern is configured to transmit the power and the signals from a combined board assembly of the plurality of circuit board assemblies.

3. The plasma display device of claim 2, wherein the combined board assembly is configured to provide logic and buffering for driving the address electrodes.

4. The plasma display device of claim 2, wherein the combined board assembly is configured to provide the address voltage for driving the address electrodes through the electrode pattern.

5. The plasma display device of claim 1, further comprising a tape carrier package (TCP) comprising the driver IC for driving the plurality of electrodes.

6. The plasma display device of claim 5, further comprising a cover plate coupled to the chassis base, wherein the driver IC is mounted on the cover plate.

7. The plasma display device of claim 6, wherein the chassis base comprises a bent portion, and the cover plate is attached to the bent portion.

8. The plasma display device of claim 6, wherein a heat dissipation pad or thermal grease is interposed between the cover plate and the driver IC.

9. The plasma display device of claim 5, wherein one end of the TCP is electrically coupled to the electrode pattern and an electrode terminal for the plurality of electrodes via thermo compression bonding.

10. The plasma display device of claim 1, further comprising a flexible printed circuit (FPC) for electrically coupling the electrode pattern to a combined board assembly of the plurality of circuit board assemblies.

11. The plasma display device of claim 10, wherein one end of the FPC is electrically coupled to the combined board assembly via a connector.

12. The plasma display device of claim 11, wherein the other end of the FPC is electrically coupled to the electrode pattern via thermo compression bonding.

13. The plasma display device of claim 10, wherein the FPC comprises at least two FPCs, and the electrode pattern is formed continuously between the at least two FPCs.

14. The plasma display device of claim 10, wherein left FPC is configured to transmit the signals to both right and left portions of the electrode pattern.

15. The plasma display device of claim 1, wherein the electrode pattern is located at an address electrode terminal side of the rear substrate.

16. The plasma display device of claim 1, wherein a width of the voltage transmission electrodes is greater than a width of the signal transmission electrodes.

17. The plasma display device of claim 1, wherein a distance between two adjacent ones of the voltage transmission electrodes is greater than a distance between two adjacent ones of the signal transmission electrodes.

18. The plasma display device of claim 1, wherein the voltage transmission electrodes further comprises a ground electrode located between the address voltage transmission electrode and the IC driving voltage transmission electrode.

19. The plasma display device of claim 1, wherein the signal transmission electrodes comprise driver IC control signal transmission electrodes and clock/address data transmission electrodes for transmitting signals to control the driver IC.

20. The plasma display device of claim 19, wherein the signal transmission electrodes further comprise a first ground electrode on one side of the clock/address data transmission electrodes and a second ground electrode on the other side of the clock/address data transmission electrodes.

21. The plasma display device of claim 19, wherein the clock/address data transmission electrodes comprise pairs of electrodes for transmitting data signals in pairs.

22. The plasma display device of claim 1, wherein the voltage transmission electrodes are outermost electrodes of the electrode pattern.

23. The plasma display device of claim 1, wherein a distance between adjacent ones of the electrodes is larger than a width of each of the adjacent ones of the electrodes.

24. The plasma display device of claim 1, further comprising a sealing member for protecting the plurality of electrodes and the electrode pattern.

25. The plasma display device of claim 1, wherein the plurality of circuit board assemblies comprises a logic board assembly and at least one interface board assembly electrically coupled between the logic board assembly and the electrode pattern.

* * * * *